(12) United States Patent
Morikazu et al.

(10) Patent No.: US 9,536,786 B2
(45) Date of Patent: Jan. 3, 2017

(54) WAFER PROCESSING METHOD USING PULSED LASER BEAM TO FORM SHIELD TUNNELS ALONG DIVISION LINES OF A SEMICONDUCTOR WAFER

(71) Applicant: DISCO CORPORATION, Tokyo (JP)

(72) Inventors: Hiroshi Morikazu, Tokyo (JP); Motohiko Shimada, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/926,308

(22) Filed: Oct. 29, 2015

(65) Prior Publication Data
US 2016/0126138 A1     May 5, 2016

(30) Foreign Application Priority Data

Nov. 5, 2014   (JP) ................................. 2014-225470

(51) Int. Cl.

| H01L 21/78 | (2006.01) |
|---|---|
| H01L 21/268 | (2006.01) |
| H01L 21/683 | (2006.01) |
| H01L 21/786 | (2006.01) |
| H01L 21/784 | (2006.01) |
| H01L 21/67 | (2006.01) |
| H01S 3/10 | (2006.01) |

(52) U.S. Cl.
CPC ............ *H01L 21/78* (2013.01); *H01L 21/268* (2013.01); *H01L 21/67092* (2013.01); *H01L 21/6836* (2013.01); *H01L 21/784* (2013.01); *H01L 21/786* (2013.01); *H01L 2221/6834* (2013.01); *H01L 2221/68327* (2013.01); *H01L 2221/68331* (2013.01); *H01S 3/10* (2013.01)

(58) Field of Classification Search
CPC ...... H01L 21/784; H01L 21/786; H01L 21/78; H01L 21/268; H01L 21/6836; H01S 3/10
See application file for complete search history.

(56) References Cited

U.S. PATENT DOCUMENTS

| 2009/0124063 A1* | 5/2009 | Nakamura ........... B23K 26/009 438/463 |
|---|---|---|
| 2012/0111495 A1* | 5/2012 | Shimoi .............. B23K 26/0057 156/250 |

(Continued)

FOREIGN PATENT DOCUMENTS

| JP | 2002-192370 | 7/2002 |
|---|---|---|
| JP | 2009-289773 | 12/2009 |

*Primary Examiner* — Michael Jung
(74) *Attorney, Agent, or Firm* — Greer Burns & Crain Ltd.

(57) ABSTRACT

A wafer is formed with a plurality of division lines on a front surface of a single crystal substrate having an off angle and formed with devices in a plurality of regions partitioned by the division lines. The wafer is processed by setting a numerical aperture (NA) of a focusing lens for focusing a pulsed laser beam so that a value obtained by dividing the numerical aperture (NA) by a refractive index (N) of the single crystal substrate falls within the range from 0.05 to 0.2. The pulsed laser beam is applied along the division lines, with a focal point of the pulsed laser beam positioned at a desired position from a back surface of the single crystal substrate, so as to form shield tunnels each composed of a pore and a pore-shielding amorphous portion along the division lines from the focal point positioned inside the single crystal substrate.

2 Claims, 10 Drawing Sheets

(56) References Cited

U.S. PATENT DOCUMENTS

| | | | | |
|---|---|---|---|---|
| 2014/0213040 A1* | 7/2014 | Morikazu | ............... | H01L 21/78 |
| | | | | 438/462 |
| 2014/0248757 A1* | 9/2014 | Morikazu | ............... | H01L 21/78 |
| | | | | 438/463 |
| 2014/0256150 A1* | 9/2014 | Morikazu | ............. | H01L 21/263 |
| | | | | 438/746 |
| 2014/0334511 A1* | 11/2014 | Takeda | ...................... | H01S 3/10 |
| | | | | 372/41 |

* cited by examiner

WAFER PROCESSING METHOD USING PULSED LASER BEAM TO FORM SHIELD TUNNELS ALONG DIVISION LINES OF A SEMICONDUCTOR WAFER

BACKGROUND OF THE INVENTION

Field of the Invention

The present invention relates to a wafer processing method by which a wafer formed with a plurality of division lines on a front side thereof and formed with respective devices in a plurality of regions partitioned by the division lines is divided along the division lines.

Description of the Related Art

In the semiconductor device manufacturing process, a plurality of regions are partitioned by crossing division lines formed on a front side of a semiconductor wafer having a substantially disk-like shape, and devices such as ICs, LSIs, liquid crystal drivers, and flash memories are formed in the partitioned regions. Then, the wafer is cut along the division lines to divide the regions formed with the devices, thereby manufacturing the individual devices.

As a method for dividing the wafer along the division lines aforementioned, there has been attempted a laser processing method in which a pulsed laser beam with such a wavelength as to be transmitted through the wafer is used, and the pulsed laser beam is applied with the focal point set inside the regions to be divided. The dividing method using the laser processing method is a technology wherein a pulsed laser beam with such a wavelength as to be transmitted through the wafer is applied from one major surface side of the wafer, with a focal point positioned inside the wafer, so as to continuously form altered layers (modified layers) inside the wafer along the division lines, and an external force is exerted along the division lines along which strength of the wafer has been lowered due to the formation of the altered layers, so as to cleave and divide the wafer. This technology is advantageous in that the width of the division lines can be made smaller (refer to, for example, Japanese Patent No. 3408805).

However, in the case of a wafer in which the surfaces of division lines are coated with a metal film, a fluorosilicate glass film, a silicon oxide passivation film ($SiO_2$, SiON), a polyimide (PI) high-molecular compound film, a fluoropolymer film, or a fluorinated amorphous carbon compound film, there arises a problem as follows. When a pulsed laser beam with such a wavelength as to be transmitted through a wafer substrate is applied with the focal point positioned inside the wafer so as to form altered layers (modified layers) inside the wafer along division lines, it is possible to divide the wafer substrate but it is impossible to divide the film coating the surfaces of the division lines.

In order to solve the above problem, there has been proposed a processing method in which a laser beam with such a wavelength as to be absorbed in the film is applied along the division lines from the front side of the wafer, to split the film along the division lines. Thereafter, a laser beam with such a wavelength as to be transmitted through the substrate is applied from the back side of the wafer along the division lines, with the focal point positioned inside the substrate, so as to form altered layers (modified layers) inside the substrate along the division lines (refer to, for example, Japanese Patent No. 5495511).

SUMMARY OF THE INVENTION

However, an upper surface of a LiN or $LiTaO_3$ substrate to be a substrate for surface acoustic wave (SAW) devices has a slight off angle with respect to the c-plane, and when altered layers (modified layers) were formed inside such a substrate by use of the technology disclosed in Japanese Patent No. 3408805, there would arise a problem as follows. The altered layers (modified layers) and cracks are formed in the manner of following the c-plane and, therefore, the wafer cannot be divided into individual devices. Such a problem as this may occur also in wafers for which a single crystal substrate of SiC, $Ga_2O_3$, AlN, $SiO_2$, Si or the like having an off angle is used.

Accordingly, it is an object of the present invention to provide a wafer processing method by which a wafer provided with a plurality of devices formed on a surface of a single crystal substrate having an off angle can be reliably divided along division lines.

In accordance with an aspect of the present invention, there is provided a method of processing a wafer formed with a plurality of division lines on a front surface of a single crystal substrate having an off angle and formed with respective devices in a plurality of regions partitioned by the division lines, the method including: a numerical aperture setting step of setting a numerical aperture (NA) of a focusing lens for focusing a pulsed laser beam so that a value obtained by dividing the numerical aperture (NA) by a refractive index (N) of the single crystal substrate falls within range from 0.05 to 0.2; a shield tunnel forming step of applying the pulsed laser beam along the division lines from a back side of the single crystal substrate, with a focal point of the pulsed laser beam positioned at a desired position from a back surface of the single crystal substrate, so as to form shield tunnels each composed of a pore and a pore-shielding amorphous portion along the division lines from the focal point positioned inside the single crystal substrate; and a wafer dividing step of applying an external force to the wafer having been subjected to the shield tunnel forming step so as to divide the wafer along the division lines, along which the shield tunnels have been formed, into individual device chips.

Preferably, a wafer supporting step of attaching a dicing tape to a back surface of the wafer and supporting an outer peripheral portion of the dicing tape by an annular frame is carried out after the shield tunnel forming step is performed and before the wafer dividing step is performed.

Preferably, a film is provided to coat surfaces of the plurality of division lines formed on the front surface of the single crystal substrate constituting the wafer, and a film splitting step of applying a laser beam with such a wavelength as to be absorbed in the film to the film along the division lines so as to split the film along the division lines is carried out before the wafer dividing step is performed.

In accordance with the laser processing method of the present invention, the numerical aperture (NA) of the focusing lens for focusing the pulsed laser beam is so set that the value obtained by dividing the numerical aperture (NA) by the refractive index (N) of a single crystal substrate having an off angle falls within the range from 0.05 to 0.2, the pulsed laser beam is applied along the division lines, with the focal point of the pulsed laser beam positioned at a desired position from the back surface of the single crystal substrate having the off angle, so as to form shield tunnels each composed of a pore and a pore-shielding amorphous portion from the focal point positioned inside the single crystal substrate having the off angle. Therefore, even in the case where the single crystal substrate constituting the wafer is a single crystal substrate having an off angle, the shield tunnels can be formed ranging from the back surface to the front surface of the single crystal substrate. Accordingly, the situation in which altered layers (modified layers) and cracks are formed in the manner of following the c-plane, as in the technology of forming altered layers (modified layers) inside a substrate as disclosed in Japanese Patent No. 3408805, is avoided. Thus, even in the case of a single crystal substrate having an off angle, shield tunnels can be reliably formed ranging from the back surface to the front surface of the single crystal substrate, and the wafer can be securely divided into individual devices.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
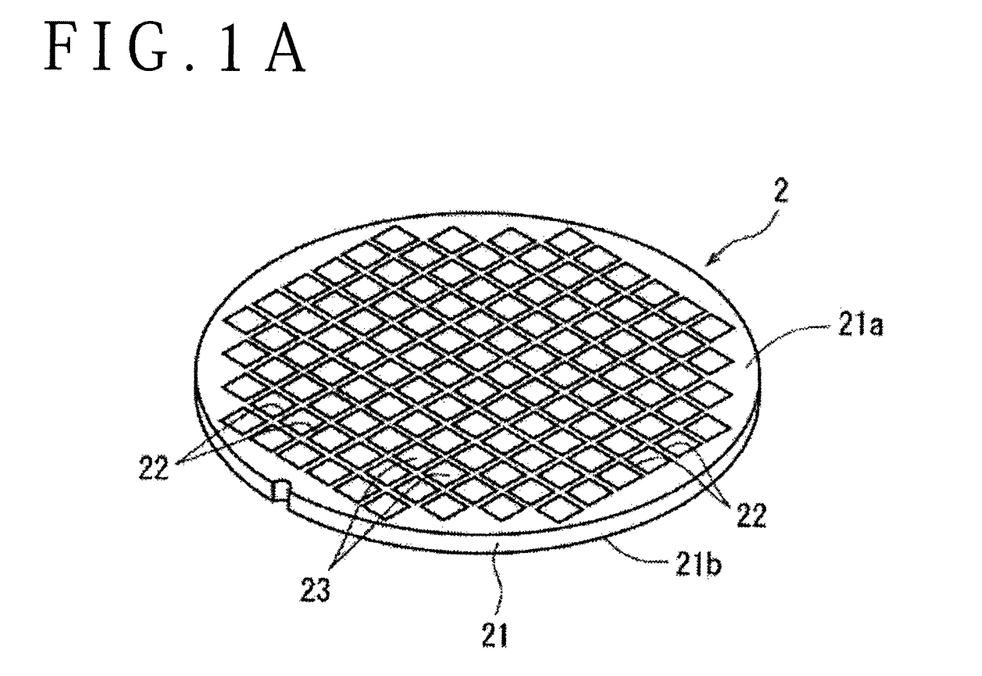
FIG. 1A is a perspective view of a wafer.
Figure 1B:
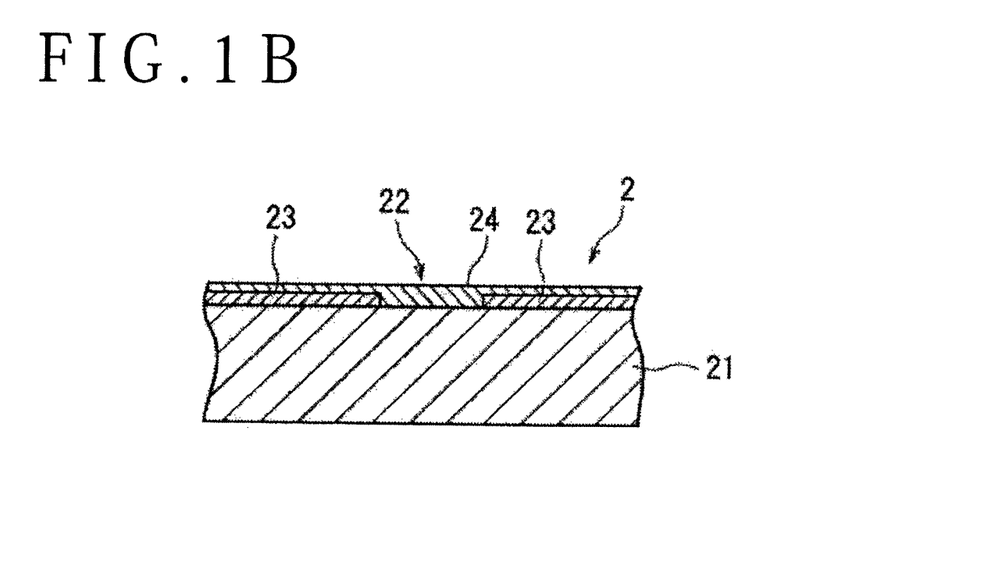
FIG. 1B is a sectional view showing in an enlarged form a major part of the wafer.

A method of processing a wafer according to the present invention will be described more in detail below, referring to the attached drawings. FIG. 1A shows a perspective view of a wafer to be processed by the method of processing a wafer according to the present invention, and FIG. 1B shows in an enlarged form a sectional view of a major part of the wafer shown in FIG. 1A. A wafer 2 shown in FIGS. 1A and 1B has a configuration in which, for example, a plurality of regions are partitioned by a plurality of crossing division lines 22 formed on a front surface 21a of a single crystal substrate (LiN substrate, LiTaO$_3$ substrate) having a thickness of 1,000 μm and having an off angle, and devices 23 such as liquid crystal drives, flash memories, semiconductor lasers, etc. are formed in the partitioned regions. As depicted in FIG. 1B, the wafer 2 is formed, on the front surface 21a including the division lines 22 and the devices 23, with a film 24 composed of a metal film, a fluorosilicate glass film, a silicon oxide passivation film (SiO$_2$, SiON), a polyimide (PI) high-molecular compound film, a fluoropolymer film, a fluorinated amorphous carbon compound film or the like.

A method of processing a wafer for dividing the aforementioned wafer 2 into individual device chips having the devices 23 will be described. First, a film splitting step is conducted in which a laser beam with such a wavelength as to be absorbed in the film 24 provided to coat the front surface 21a of the substrate 21 constituting the wafer 2 is applied to the film 24 along the division lines 22 from the front side of the wafer, so as to split the film 24 along the division lines 22. This film splitting step is carried out by use of a laser processing apparatus 3 illustrated in FIG. 2. The laser processing apparatus 3 shown in FIG. 2 includes a chuck table 31 for holding a workpiece, laser beam applying means 32 for applying a laser beam to the workpiece held on the chuck table 31, and imaging means 33 for imaging the workpiece held on the chuck table 31. The chuck table 31 is configured to hold the workpiece by suction, and is so configured as to be moved in a processing feed direction indicated by arrow X in FIG. 2 by a processing feeding mechanism (not shown) and be moved in an indexing feed direction indicated by arrow Y in FIG. 2 by an indexing feeding mechanism (not shown).

Figure 2:
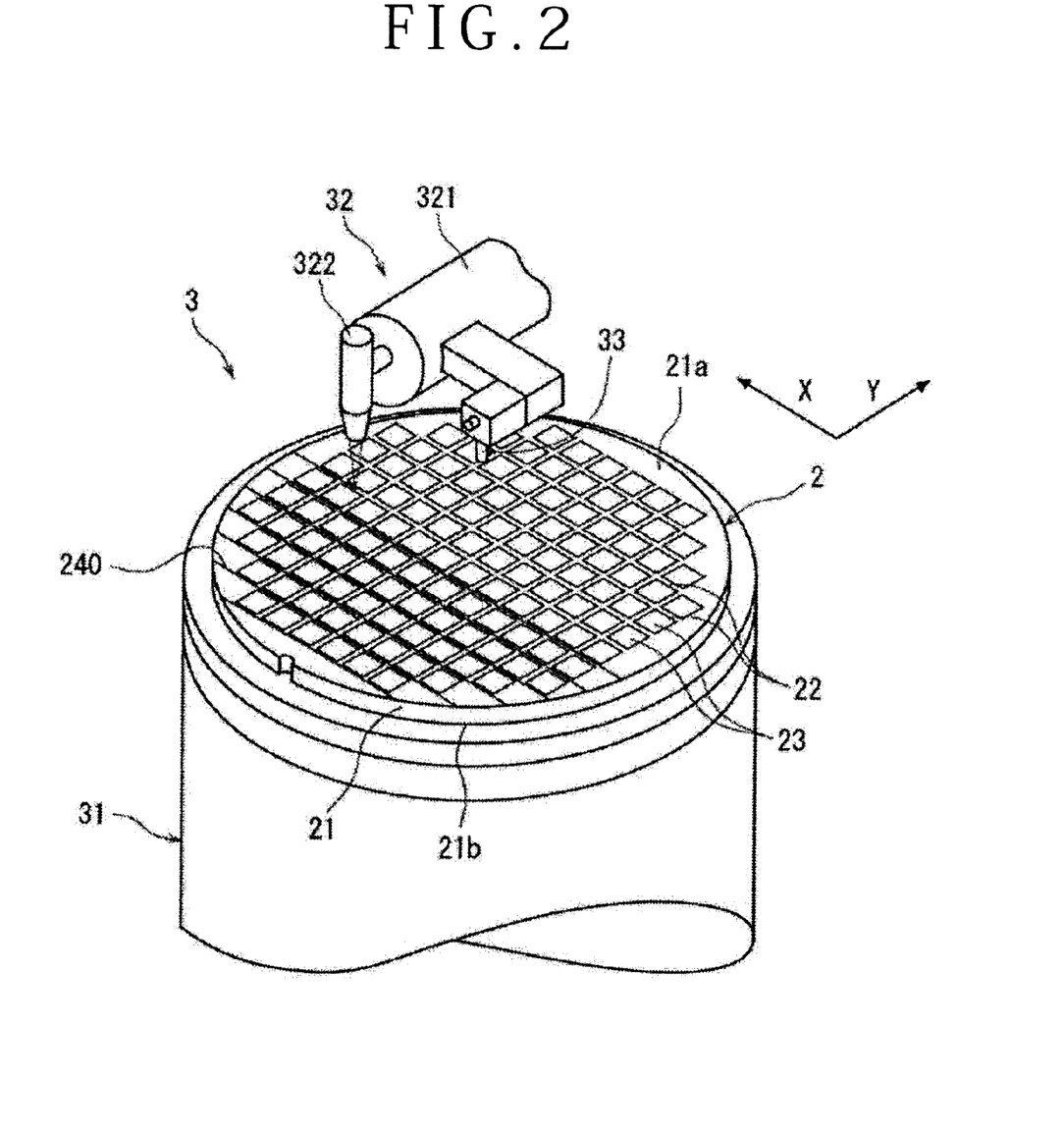
FIG. 2 is a perspective view of a major part of a laser processing apparatus for carrying out a film splitting step.

The laser beam applying means 32 includes a hollow cylindrical casing 321 disposed substantially horizontally. Inside the casing 321 is disposed pulsed laser beam oscillating means which includes a pulsed laser oscillator (not shown), such as a YAG laser oscillator or a YVO4 laser oscillator, and repetition frequency setting means. At a tip portion of the casing 321, focusing means 322 for focusing the pulsed laser beam oscillated from the pulsed laser beam oscillating means is mounted.

The imaging means 33 mounted at a tip portion of the casing 321 constituting the laser beam applying means 32 includes not only an ordinary imaging element (CCD) for imaging by use of visible rays but also infrared illuminating means for illuminating the workpiece with infrared rays, an optical system for capturing the infrared rays radiated from the infrared illuminating means, an imaging element (infrared CCD) for outputting an electrical signal corresponding to the infrared rays captured by the optical system and the like. The imaging means 33 sends an image signal obtained by the imaging to control means (not shown).

The film splitting step carried out using the aforementioned laser processing apparatus 3 will be described referring to FIGS. 2 and 3A to 3C. In the film splitting step, first, the wafer 2 is placed on the chuck table 31 of the laser processing apparatus 3 depicted in FIG. 2, with a back surface 21b of the wafer 2 on the lower side. Then, suction means (not shown) is operated so as to hold the wafer 2 onto the chuck table 31 (wafer holding step). Consequently, the wafer 2 held on the chuck table 31 has its front surface 21a on the upper side.

The chuck table 31 with the wafer 2 suction held thereon as aforementioned is positioned directly below the imaging means 33 by the processing feeding mechanism (not shown). When the chuck table 31 is positioned directly below the imaging means 33, an alignment operation for detecting a region to be laser processed of the wafer 2 is carried out by the imaging means 33 and the control means (not shown). Specifically, the imaging means 33 and the control means (not shown) perform alignment of a laser beam applying position by carrying out image processing such as pattern matching for positional matching between the division line 22 formed in a first direction on the wafer 2 and the focusing means 322 of the laser beam applying means 32 for applying the laser beam along the division line 22. Similarly, alignment of the laser beam applying position is carried out also for the division line 22 extending in a direction orthogonal to the first direction on the wafer 2 (alignment step). It is to be noted that in the alignment step, even in the case where the film 24 coating the front surface 21a including the division lines 22 and the devices 23 of the wafer 2 is not transparent, the division lines 22 can be imaged through the film 24, since the imaging means 33 includes the imaging means composed of the infrared illuminating means, the optical system for capturing the infrared rays, the imaging element (infrared CCD) for outputting an electrical signal corresponding to the infrared rays and the like.

Figure 3A:
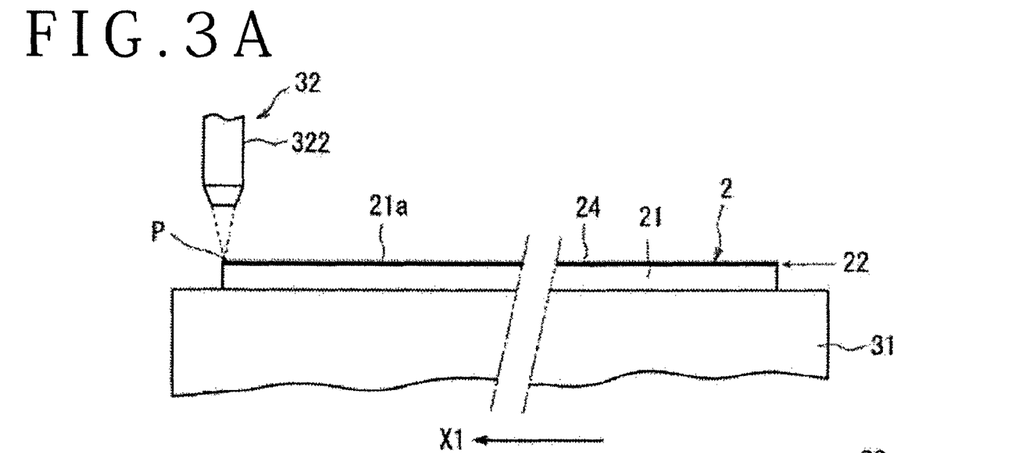
FIGS. 3A to 3C illustrate the film splitting step.
Figure 3B:
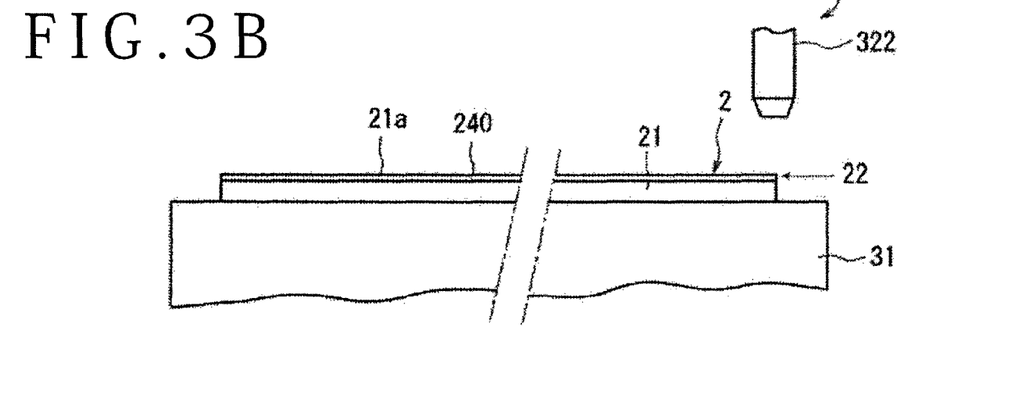

When the division line 22 formed on the wafer 2 held on the chuck table 31 has been detected and the alignment of the laser beam applying position has been performed in this manner, the chuck table 31 is moved into a laser beam applying region where the focusing means 322 of the laser beam applying means 32 for applying the laser beam is positioned, and a predetermined division line 22 is positioned directly below the focusing means 322, as shown in FIG. 3A. In this instance, as shown in FIG. 3A, the semiconductor wafer 2 is so positioned that one end (the left end in FIG. 3A) of the division line 22 is positioned directly below the focusing means 322. Next, while a pulsed laser beam with such a wavelength as to be absorbed in the film 24 on the wafer 2 is being applied from the focusing means 322 of the laser beam applying means 32, the chuck table 31 is moved at a predetermined processing feed speed in a direction indicated by arrow X1 in FIG. 3A. Then, when the other end (the right end in FIG. 3B) of the division line 22 has reached the position directly below the focusing means 322 as depicted in FIG. 3B, the application of the pulsed laser beam is stopped, and the movement of the chuck table 31 is stopped. During this film splitting step, a focal point P of the pulsed laser beam is adjusted to the vicinity of the surface (upper surface) of the film 24 provided to coat the front surface of the wafer 2.

Figure 3C:
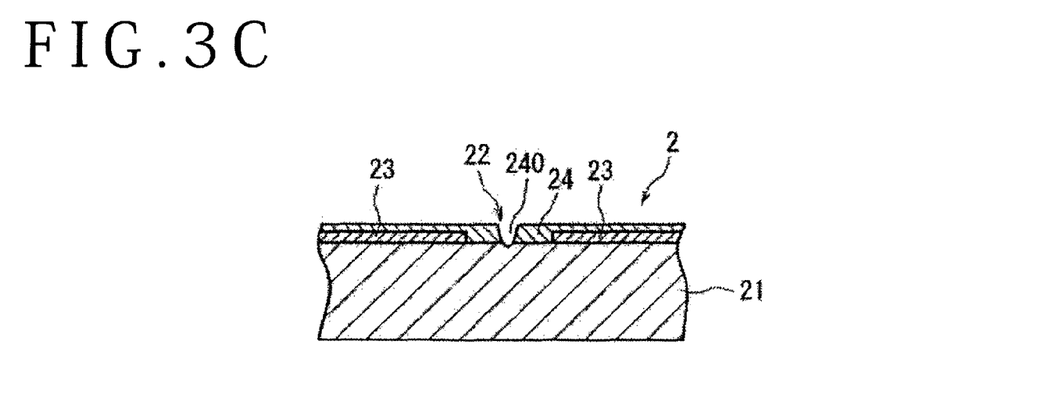

With the aforementioned film splitting step carried out, a laser processed groove 240 reaching the substrate 21 is formed in the film 24 along the division line 22, as shown in FIG. 3C. As a result, the film 24 coating the division line 22 is split along the division line 22 by the laser processed groove 240.

It is to be noted that the film splitting step is carried out, for example, under the following processing conditions.

Figure 4A:
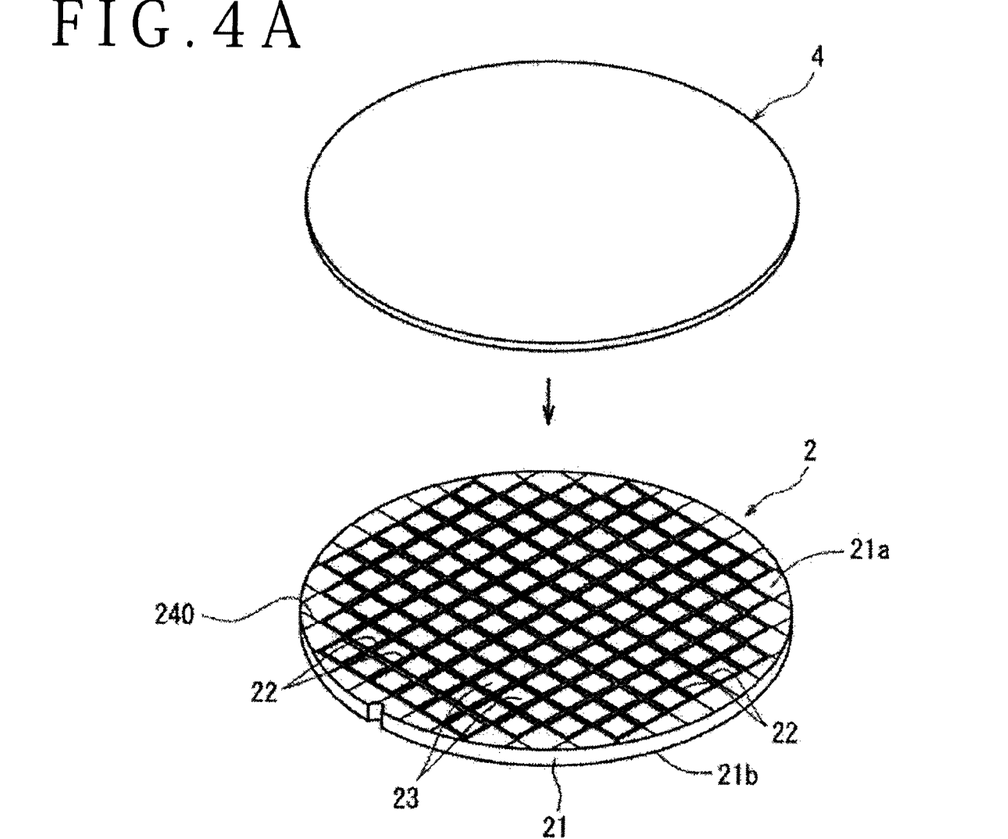
FIGS. 4A and 4B illustrate a protective tape attaching step.
Figure 4B:
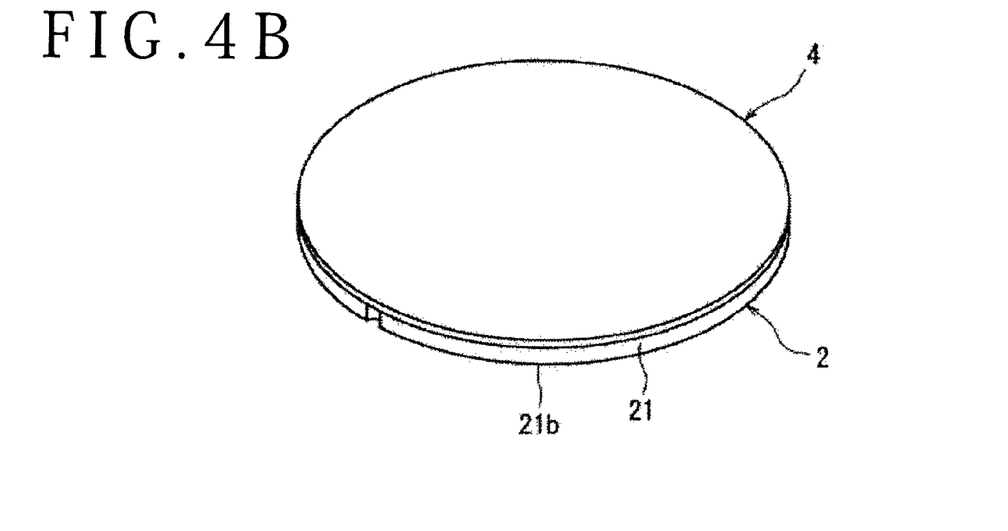

Light source: YAG pulsed laser
Wavelength: 355 nm
Average output: 1 W
Repetition frequency: 50 kHz
Focused spot diameter: 10 μm
Processing feed speed: 100 mm/second When the aforementioned film splitting step has been carried out along all the division lines 22 extending in the first direction on the wafer 2 as above, the chuck table 31 is rotated 90 degrees, and the aforementioned film splitting step is carried out along each of the division lines 22 extending in the direction orthogonal to the first direction. After the aforementioned film splitting step is carried out, a protective tape 4 formed from polyvinyl chloride or the like is attached to the front surface 21a of the wafer 2 as shown in FIGS. 4A and 4B, for the purpose of protecting the devices 23 formed at the surface of the wafer 2 (protective tape attaching step).

Subsequently, a shield tunnel forming step is conducted wherein the pulsed laser beam is applied along the division line 22 from the back side of the single crystal substrate 21, with the focal point of the pulsed laser beam positioned at a desired position from the back surface of the single crystal substrate 21, whereby shield tunnels each composed of a pore and a pore-shielding amorphous portion extending from the focal point positioned inside the single crystal substrate 21 are formed along the division line 22. This shield tunnel forming step is carried out using a laser processing apparatus 5 depicted in FIG. 5. The laser processing apparatus 5 shown in FIG. 5 includes: a chuck table 51 for holding a workpiece thereon; laser beam applying means 52 for applying a laser beam to the workpiece held on the chuck table 51; and imaging means 53 for imaging the workpiece held on the chuck table 51. The chuck table 51 is configured to hold the workpiece by suction, and is configured so as to be moved in a processing feed direction indicated by arrow X in FIG. 5 by processing feeding means (not shown) and be moved in an indexing feed direction indicated by arrow Y in FIG. 5 by indexing feeding means (not shown).

Figure 5:
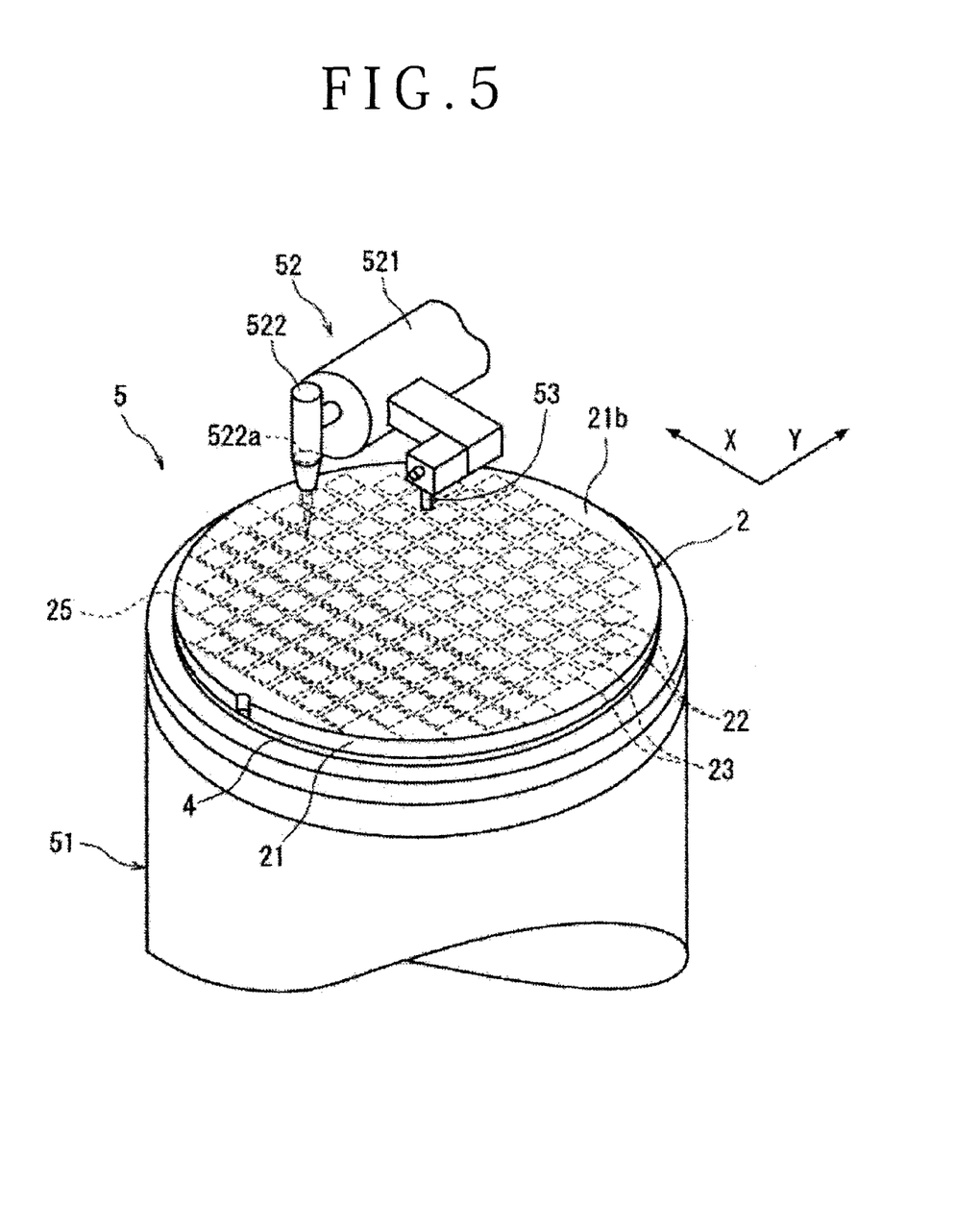
FIG. 5 is a perspective view of a major part of a laser processing apparatus for carrying out a shield tunnel forming step.

The laser beam applying means 52 includes a hollow cylindrical casing 521 disposed substantially horizontally. Inside the casing 521 is disposed pulsed laser beam oscillating means (not shown) which includes a pulsed laser oscillator and repetition frequency setting means. At a tip portion of the casing 521, focusing means 522 having a focusing lens 522a for focusing the pulsed laser beam oscillated from the pulsed laser beam oscillating means is mounted. The focusing lens 522a of the focusing means 522 has a numerical aperture (NA) which is set as follows. The numerical aperture (NA) of the focusing leas 522a is so set that a value obtained by dividing the numerical aperture (NA) by the refractive index (N) of the single crystal substrate falls within the range of from 0.05 to 0.2 (numerical aperture setting step). It is to be noted that the laser beam applying means 52 includes focal position adjusting means (not shown) for adjusting the focal position of the pulsed laser beam focused by the focusing lens 522a of the focusing means 522.

Imaging means 53 mounted at a tip portion of the casing 521 constituting the laser beam applying means 52 includes not only an ordinary imaging element (CCD) for imaging with visible rays but also infrared illuminating means for illuminating the workpiece with infrared rays, an optical system for capturing the infrared rays radiated by the infrared illuminating means, an imaging element (infrared CCD) for outputting an electrical signal corresponding to the infrared rays captured by the optical system and the like, and sends an image signal obtained upon imaging to control means (not shown).

In order to perform laser processing along the division lines 22 of the wafer 2, which has been subjected to the aforementioned protective tape attaching step, by the aforementioned laser processing apparatus 5, a positioning step is conducted wherein the focusing lens and the single crystal substitute 21 constituting the wafer 2 are positioned relative to each other in the optical axis direction of the focusing lens so that the focal point of the pulsed laser beam is positioned at a desired position in the thickness direction of the single crystal substrate 21. First, the wafer 2 with the protective tape 4 attached thereto is placed on the chuck table 51 of the aforementioned laser processing apparatus 5 shown in FIG. 5, with the protective tape 4 side on the lower side. Then, suction means (not shown) is operated so as to hold the wafer 2 on the chuck table 51 through the protective tape 4 therebetween (wafer holding step). Consequently, the wafer 2 held on the chuck table 51 is so disposed that the back surface 21b of the single crystal substrate 21 is on the upper side. The chuck table 51 holding the wafer 2 by suction in this way is positioned directly below the imaging means 53 by processing feeding means (not shown).

When the chuck table 51 has been positioned directly below the imaging means 53, an alignment operation of detecting a region to be laser processed of the wafer 2 is carried out by the imaging means 53 and control means (not shown). Specifically, the imaging means 53 and the control means (not shown) perform alignment of a laser beam applying position by carrying out imaging processing such as pattern matching for positional matching between the division line 22 formed in the first direction on the wafer 2 and the focusing means 522 of the laser beam applying means 52 for applying a laser beam along the division line 22 (alignment step). Similarly, alignment of the laser beam applying position is carried out also for the division line 22 formed in the direction orthogonal to the first line on the wafer 2. In this instance, although the front surface 21a of the single crystal substrate 21 formed with the division lines 22 of the wafer 2 is located on the lower side, the division lines 22 can be imaged through the back surface 21b of the single crystal substrate 21, since the imaging means 53 includes the imaging means composed of the infrared illuminating means, the optical system for capturing the infrared rays, the imaging element (infrared CCD) for outputting an electrical signal corresponding to the infrared rays and the like, as aforementioned.

Figure 6A:
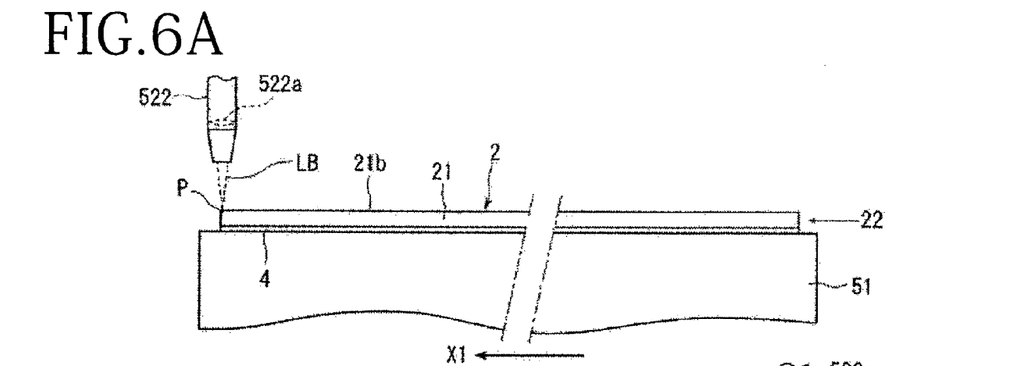
FIGS. 6A to 6E illustrate the shield tunnel forming step.

When the aforementioned alignment step has been performed, the chuck table 51 is moved into a laser beam applying region where the focusing means 522 of the laser beam applying means 52 for applying the laser beam is positioned, and a predetermined division line 22 is positioned directly below the focusing means 522, as depicted in FIG. 6A. In this instance, as shown in FIG. 6A, the wafer 2 is so positioned that one end (the left end in FIG. 6A) of the division line 22 is positioned directly below the focusing means 522. Then, the focusing means 522 is moved in its optical axis direction by operating the focal position adjusting means (not shown) so that the focal point P of a pulsed laser beam LB focused by the focusing lens 522a of the focusing means 522 is positioned at a desired position in the thickness direction of the single crystal substrate 21 constituting the wafer 2 (positioning step). It is to be noted that in the present embodiment, the focal point P of the pulsed laser beam is set at a desired position (for example, a position spaced by 5 μm to 10 μm from the back surface 21b) from the upper surface (the back surface 21b side) on which the pulsed laser beam is incident of the single crystal substrate 21 constituting the wafer 2.

Figure 6B:
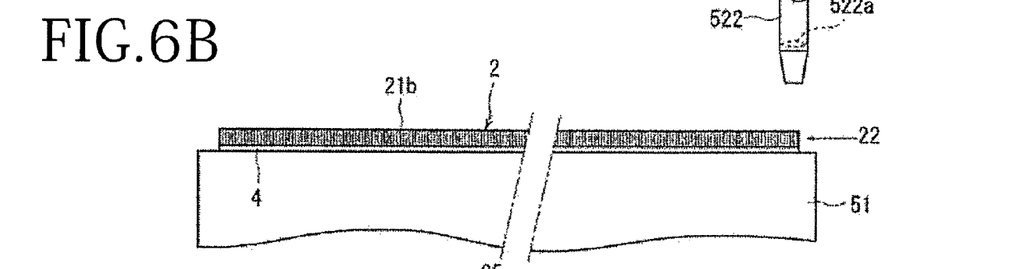

When the positioning step has been performed as above, the shield tunnel forming step is carried out wherein the laser beam applying means 52 is operated to apply a pulsed laser beam LB from the focusing means 522 so that pores and pore-shielding amorphous portions each extending from the vicinity (the upper surface (the back surface 21b)) of the focal point P positioned inside the single crystal substrate 21 constituting the wafer 2 toward the lower surface (the front surface 21a) are formed, whereby shield tunnels are formed. Specifically, while the pulsed laser beam LB with such a wavelength as to be transmitted through the single crystal substrate 21 constituting the wafer 2 is being radiated from the focusing means 522, the chuck table 51 is moved at a predetermined feed speed in the direction indicated by arrow X1 in FIG. 6A (shield tunnel forming step). Then, when the other end (the right end in FIG. 6B) of the division line 22 has reached the applying position of the focusing means 522 of the laser beam applying means 52 as shown in FIG. 6B, the application of the pulsed laser beam is stopped, and the movement of the chuck table 51 is stopped.

Figures 6C, 6D, 6E:
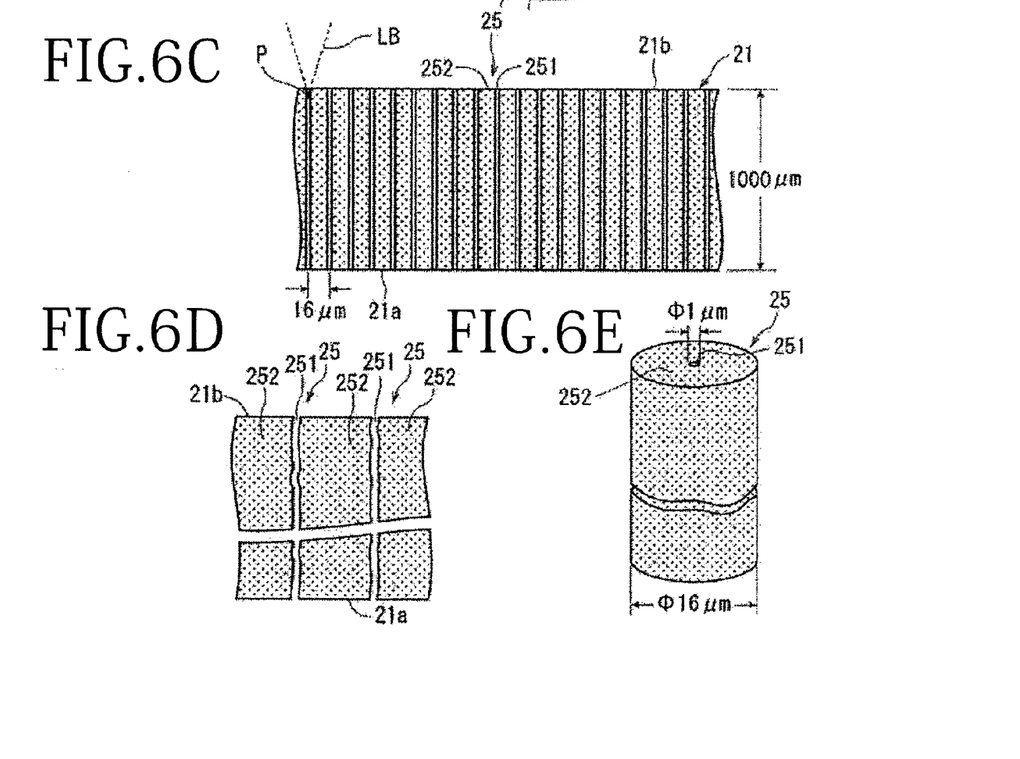

With the aforementioned shield tunnel forming step carried out, pores 251 and amorphous portions 252 formed around the pores 251 are grown to each extend from the vicinity (the upper surface (the back surface 21b)) of the focal point P of the pulsed laser beam LB toward the lower surface (the front surface 21a), as shown in the enlarged sectional view in FIG. 6C, whereby amorphous shield tunnels 25 are formed at a predetermined interval (in the present embodiment, an interval of 16 μm=(processing feed speed: 800 mm/second)/(repetition frequency: 50 kHz)) along the division line 22. As shown in FIGS. 6D and 6E, the shield tunnel 25 is composed of the pore 251 formed in the center in a diameter of about 1 μm and the amorphous portion 252 formed around the pore 251 to have a diameter of 16 μm. In the present embodiment, the shield tunnels 25 are so formed that the adjacent amorphous portions 252 are continuous with each other. It is to be noted that the amorphous shield tunnels 25 formed in the aforementioned shield tunnel forming step can be formed to extend from the upper surface (back surface 21b) to the lower surface (front surface 21a) even where the single crystal substrate 21 constituting the wafer 2 is a single crystal substrate having an off angle. In addition, even where the thickness of the single crystal substrate 21 is large, it is sufficient to apply the pulsed laser beam only once. Thus, an extremely high productivity can be realized.

When the shield tunnel forming step has been carried out along the predetermined division line 22 as above, the chuck table 51 is put to indexing feeding in the direction of arrow Y by a distance equal to the interval of the division lines 22 formed on the wafer 2 (indexing step), and the shield tunnel forming step is performed. When the shield tunnel forming step has been carried out along all the division lines 22 formed in the first direction, the chuck table 51 is rotated 90 degrees, and then the shield tunnel forming step is performed along the division lines 22 extending in the direction orthogonal to the division lines 22 formed in the first direction.

In order to form good shield tunnels 25 in the aforementioned shield tunnel forming step, it is important that the numerical aperture (NA) of the focusing lens 522a be so set that the value (S) obtained by dividing the numerical aperture (NA) by the refractive index (N) of the single crystal substrate falls within the range from 0.05 to 0.2. Here, the relationships between the numerical aperture (NA) and the refractive index (N) and the value (S=NA/N) obtained by dividing the numerical aperture (NA) by the refractive index (N) are described referring to FIG. 7.

Figure 7:
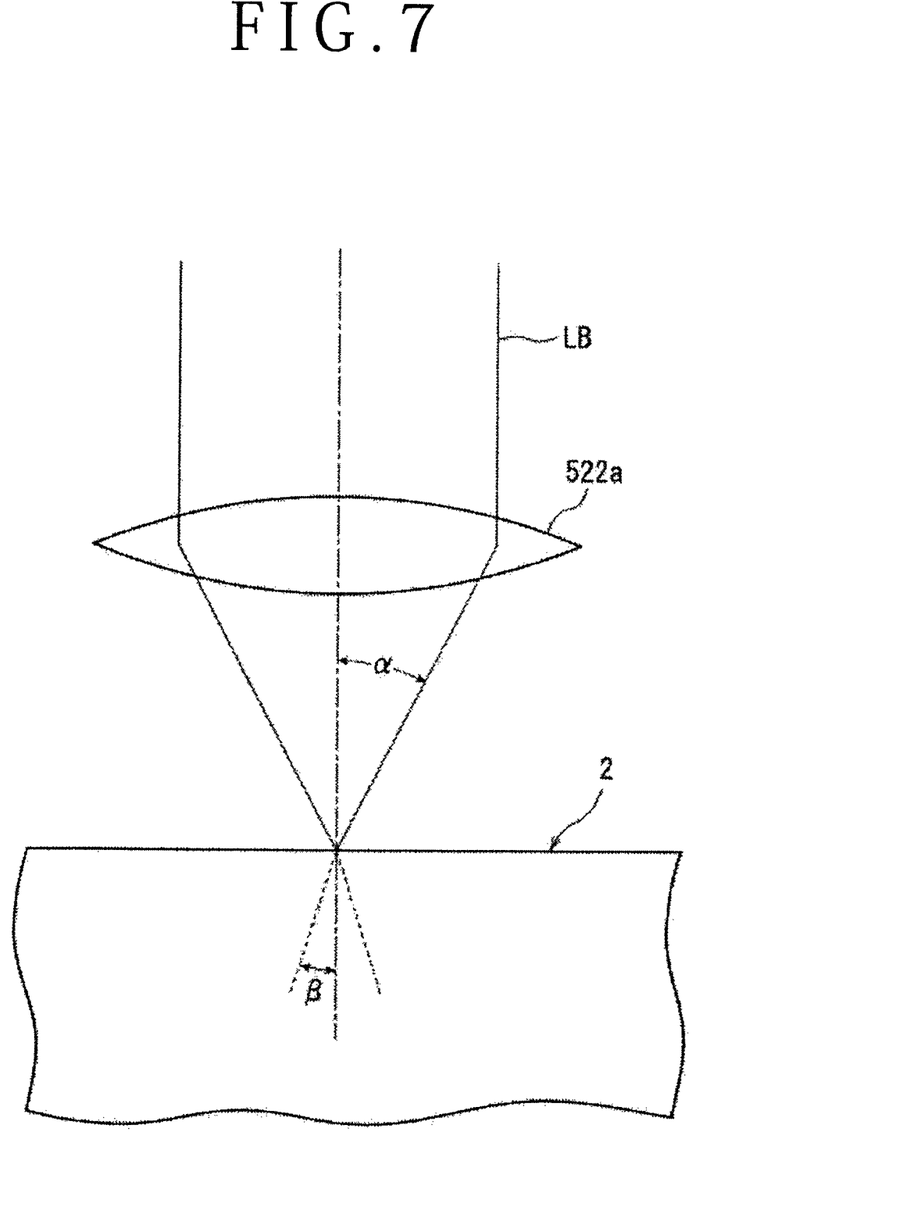
FIG. 7 is a figure showing the relationship among the numerical aperture (NA) of a focusing lens, the refractive index (N) of a single crystal substrate constituting a wafer, and a value (S=NA/N) obtained by dividing the numerical aperture (NA) by the refractive index (N)

In FIG. 7, the pulsed laser beam LB incident on the focusing lens 522a is focused with an angle (α) with respect to the optical axis of the focusing lens 522a. In this instance, sin α is the numerical aperture (NA) of the focusing lens 522a (NA=sin θ). When the pulsed laser beam LB focused by the focusing lens 522a is applied to the single crystal substrate 21 constituting the wafer 2, the pulsed laser beam LB is refracted from the angle (α) to an angle (β), since the single crystal substrate 21 is higher than air in density. In this case, the angle (β) with respect to the optical axis of the focusing lens 522a differs depending on the refractive index (N) of the single crystal substrate 21. Since the refractive index (N) is N=sin α/sin β, the value (S=NA/N) obtained by dividing the numerical aperture (NA) by the refractive index (N) of the single crystal substrate is sinβ. Accordingly, it is important to set sin β to within the range from 0.05 to 0.2 (0.05≤sin β≤0.2).

The reason why the value (S=NA/N) obtained by dividing the numerical aperture (NA) of the focusing lens 522a by the refractive index (N) of the single crystal substrate has been set to within the range 0.05 to 0.2 will be described below, on the basis of experiments conducted by the present inventors.

[Experiment 1-1]

A LiN substrate (refractive index: 2.2) having a thickness of 1,000 μm was formed with shield tunnels under the following processing conditions, and the quality (good or bad) of the shield tunnels was determined.

Processing Conditions
Light source: YAG pulsed laser
Wavelength: 1,030 nm
Repetition frequency: 50 kHz
Pulse width: 10 ps
Average output: 3 W
Spot diameter: 10 μm
Processing feed speed: 800 mm/second

| Numerical aperture (NA) of focusing lens | Quality of shield tunnels | S = NA/N |
|---|---|---|
| 0.05 | absent | |
| 0.1 | rather good | 0.045 |
| 0.15 | good | 0.068 |
| 0.2 | good | 0.091 |
| 0.25 | good | 0.114 |
| 0.3 | good | 0.136 |
| 0.35 | good | 0.159 |
| 0.4 | good | 0.182 |
| 0.45 | rather good | 0.205 |
| 0.5 | bad: void formed | 0.227 |
| 0.55 | bad: void formed | |
| 0.6 | bad: void formed | |

As seen from the above, in the case of the LiN substrate (refractive index: 2.2), when the value (S=NA/N) obtained by dividing the numerical aperture (NA) of the focusing lens 522a for focusing the pulsed laser beam by the refractive index (N) of the LiN substrate is set to within the range from 0.05 to 0.2, the shield tunnels are formed. Accordingly, in the case of the LiN substrate, it is important that the numerical aperture (NA) of the focusing lens 522a for focusing the pulsed laser beam be set to within the range from 0.1 to 0.45.

[Experiment 1-2]

A LiTaO₃ substrate (refractive index: 2.1) having a thickness of 1,000 μm was formed with shield tunnels under the following processing conditions, and the quality (good or bad) of the shield tunnels was determined.

Processing Conditions
Light source: YAG pulsed laser
Wavelength: 1,030 nm
Repetition frequency: 50 kHz
Pulse width: 10 ps
Average output: 3 W
Spot diameter: 10 μm
Processing feed speed: 800 mm/second

| Numerical aperture (NA) of focusing lens | Quality of shield tunnels | S = NA/N |
|---|---|---|
| 0.1 | rather good | 0.047 |
| 0.15 | good | 0.057 |
| 0.2 | good | 0.095 |
| 0.25 | good | 0.119 |
| 0.3 | good | 0.143 |
| 0.35 | good | 0.166 |
| 0.4 | good | 0.190 |
| 0.45 | bad: void formed | 0.214 |
| 0.5 | bad: void formed | 0.238 |
| 0.55 | bad: void formed | |
| 0.6 | bad: void formed | |

As seen from the above, in the case of the LiTaO₃ substrate (refractive index: 2.1), when the value (S=NA/N) obtained by dividing the numerical aperture (NA) of the focusing lens 522a for focusing the pulsed laser beam by the refractive index (N) of the LiTaO₃ substrate is set to within the range from 0.05 to 0.2, the shield tunnels are formed. Accordingly, in the case of the LiTaO₃ substrate, it is important that the numerical aperture (NA) of the focusing lens 522a for focusing the pulsed laser beam be set to within the range from 0.1 to 0.4.

[Experiment 1-3]

A SiC substrate (refractive index: 2.63) having a thickness of 1,000 μm was formed with shield tunnels under the following processing conditions, and the quality (good or bad) of the shield tunnels was determined.

Processing Conditions
Light source: YAG pulsed laser
Wavelength: 1,030 nm
Repetition frequency: 50 kHz
Pulse width: 10 ps
Average output: 3 W
Spot diameter: 10 μm
Processing feed speed: 800 mm/second

| Numerical aperture (NA) of focusing lens | Quality of shield tunnels | S = NA/N |
|---|---|---|
| 0.05 | absent | |
| 0.1 | absent | |
| 0.15 | rather good | 0.057 |
| 0.2 | good | 0.076 |
| 0.25 | good | 0.095 |
| 0.3 | good | 0.114 |
| 0.35 | good | 0.133 |
| 0.4 | good | 0.152 |
| 0.45 | good | 0.171 |
| 0.5 | good | 0.19 |
| 0.55 | rather good | 0.209 |
| 0.6 | bad: void formed | |

As seen from the above, in the case of the SiC substrate (refractive index: 2.63), when the value (S=NA/N) obtained by dividing the numerical aperture (NA) of the focusing lens 522a for focusing the pulsed laser beam by the refractive index (N) of the SiC substrate is set to within the range from 0.05 to 0.2, the shield tunnels are formed. Accordingly, in the case of the SiC substrate, it is important that the numerical aperture (NA) of the focusing lens 522a for focusing the pulsed laser beam be set to within the range from 0.15 to 0.55.

From the aforementioned Experiment 1-1, Experiment 1-2, and Experiment 1-3, it has been confirmed that shield tunnels are reliably formed when the value (S=NA/N) obtained by dividing the numerical aperture (NA) of a focusing lens 522a for focusing a pulsed laser beam by the refractive index (N) of a single crystal substrate is set to within the range from 0.05 to 0.2.

Figure 8A:
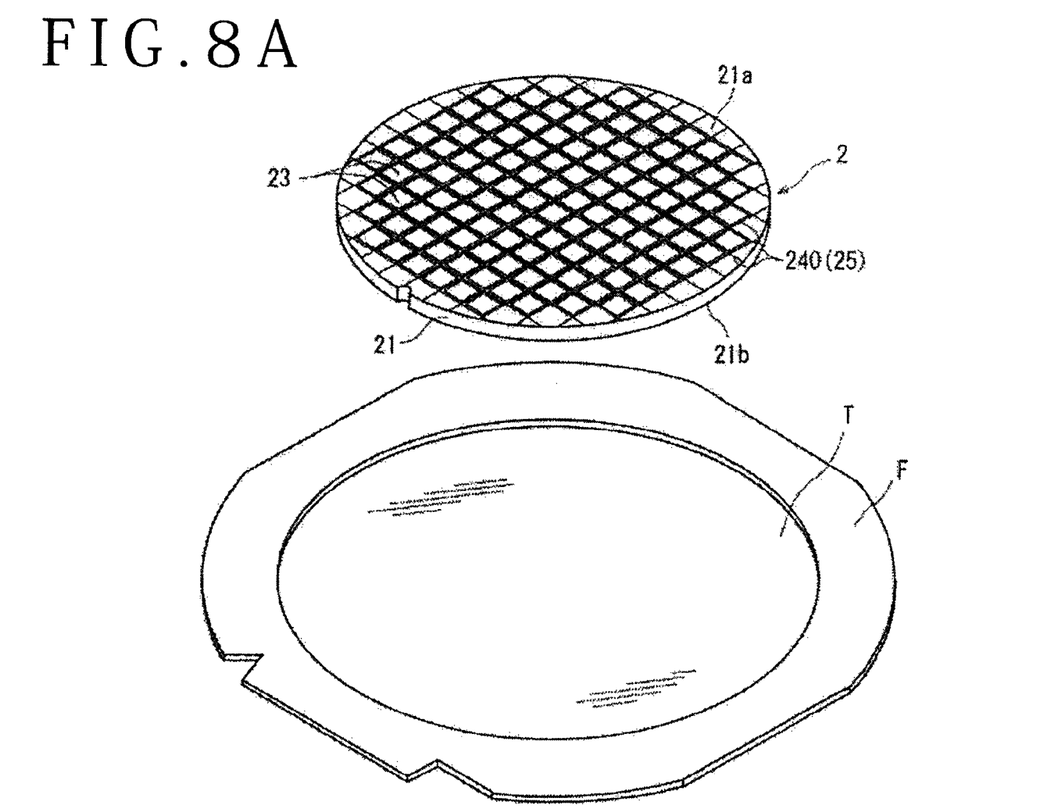
FIGS. 8A and 8B illustrate a wafer supporting step.
Figure 8B:
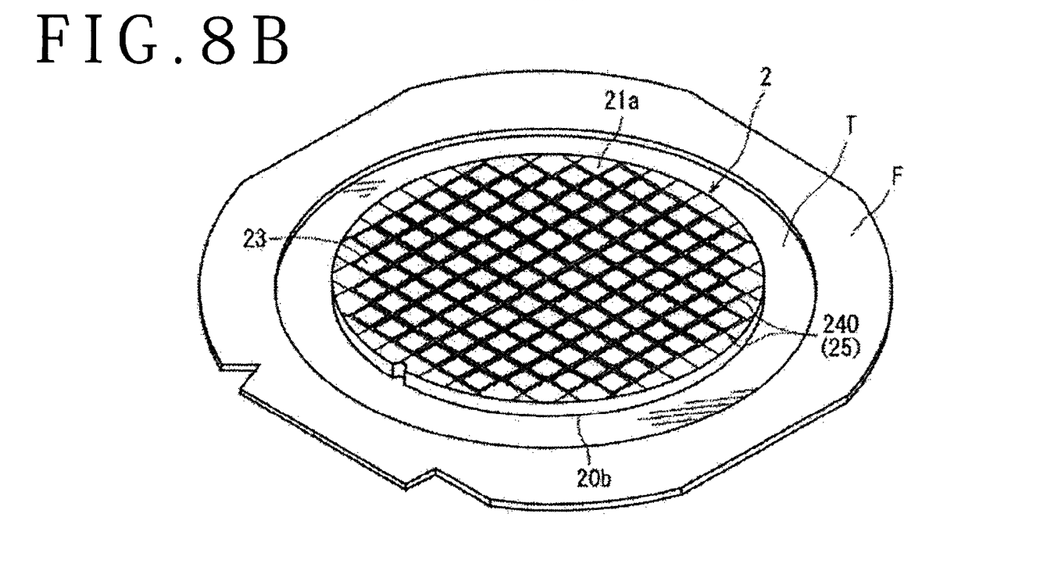

When the aforementioned shield tunnel forming step has been performed, a wafer supporting step is carried out wherein a dicing tape is attached to the back surface of the wafer 2 and an outer peripheral portion of the dicing tape is supported by an annular frame. Specifically, as shown in FIGS. 8A and 8B, the back surface 21b of the single crystal substrate 21 constituting the wafer 2 having been subjected to the shield tunnel forming step is adhered to a dicing tape T attached to an annular frame F. While an example in which the back surface 21b of the single crystal substrate 21 constituting the wafer 2 is adhered to the dicing tape T attached to the annular frame F is shown in the present invention illustrated in FIGS. 8A and 8B, a method may be adopted in which the dicing tape T is adhered to the back surface 21b of the single crystal substrate 21 constituting the wafer 2 and, simultaneously, an outer peripheral portion of the dicing tape T is attached to the annular frame F.

Figure 9:
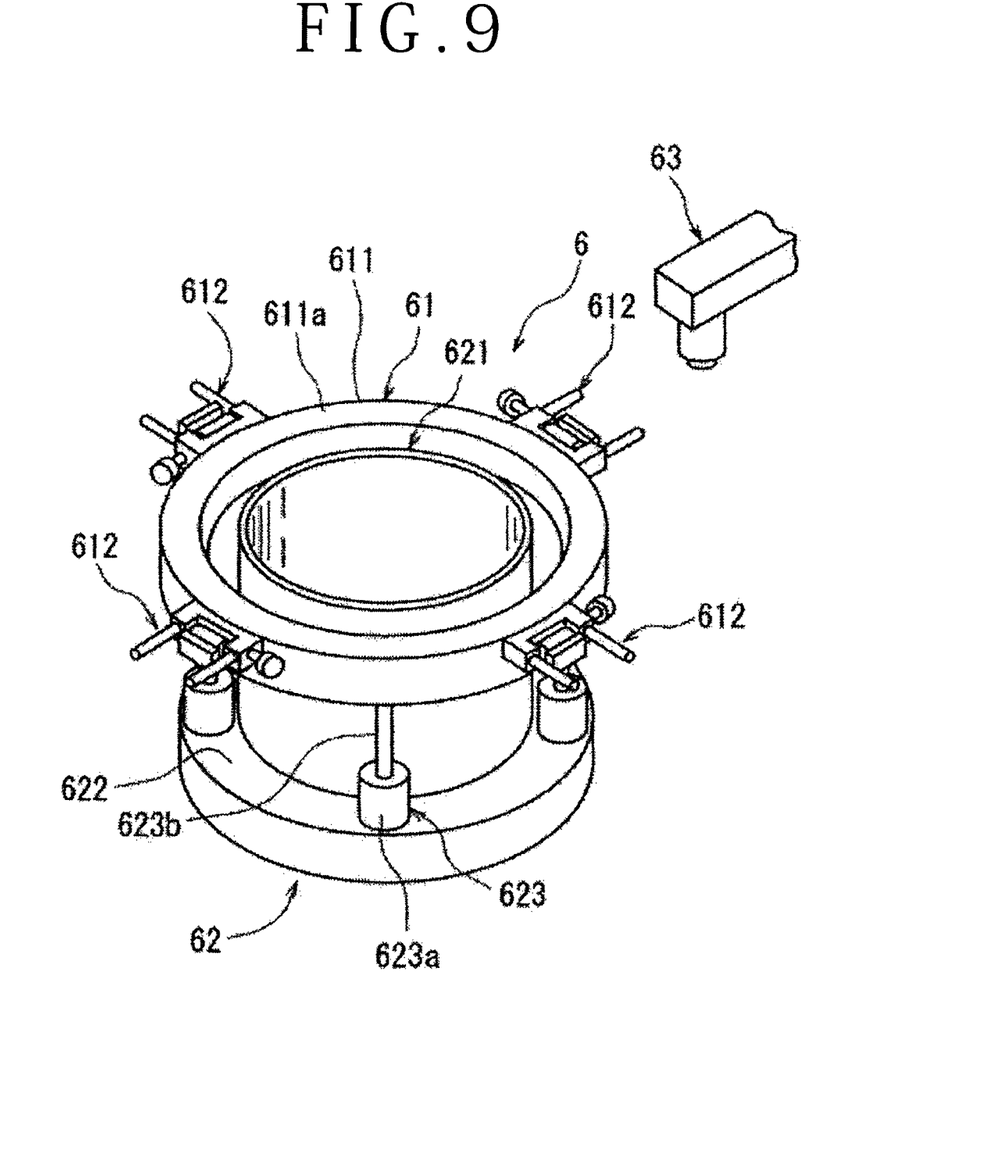
FIG. 9 is a perspective view of a dividing apparatus for carrying out a wafer dividing step.

When the aforementioned wafer supporting step has been conducted, a wafer dividing step is carried out wherein an external force is applied to the wafer 2 so that the wafer 2 is divided along the division lines, along which the shield tunnels 25 have been formed, into individual device chips having the respective devices 23. The wafer dividing step is carried out using a dividing apparatus 6 depicted in FIG. 9. The dividing apparatus 6 shown in FIG. 9 includes frame holding means 61 for holding the annular frame F, tape expanding means 62 for expanding the wafer 2 attached to the annular frame F held by the frame holding means 61, and a pick-up collet 63. The frame holding means 61 is composed of an annular frame holding member 611, and a plurality of clamps 612 as fixing means disposed at an outer periphery of the frame holding member 611. An upper surface of the frame holding member 611 forms a mount surface 611a on which to mount the annular frame F, and the annular frame F is mounted on the mount surface 611a. Then, the annular frame F mounted on the mount surface 611a is fixed to the frame holding member 611 by the clamps 612. The frame holding means 61 configured in this manner is supported by the tape expanding means 62 so that it can be advanced and retracted in the vertical direction.

Figure 10A:
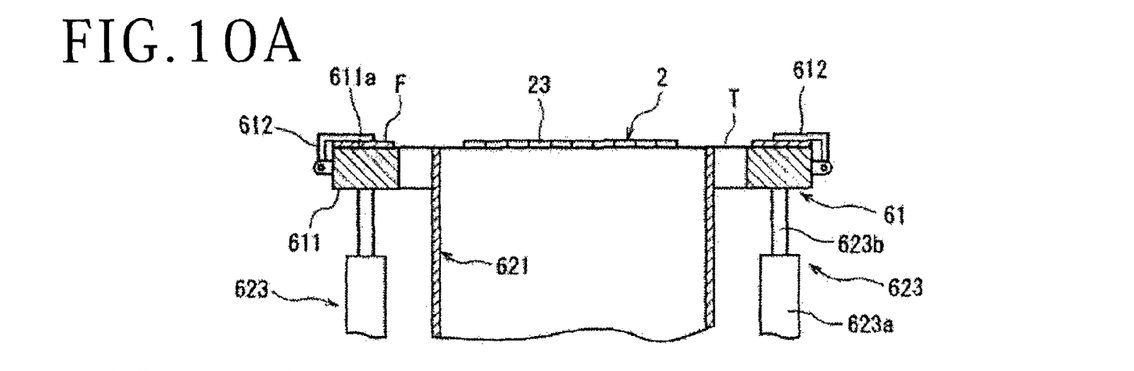
FIGS. 10A to 10C illustrate the wafer dividing step.
Figure 10B:
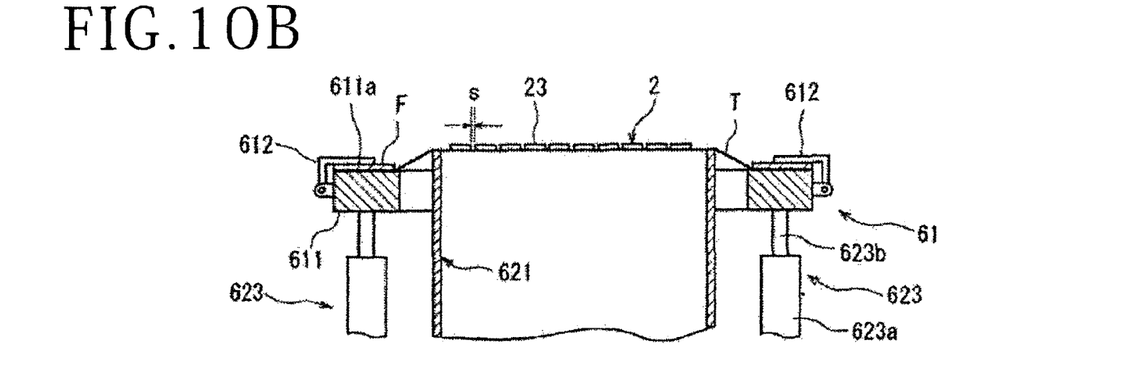

The tape expanding means 62 includes an expansion drum 621 disposed inside of the annular frame holding member 611. The expansion drum 621 has an inside diameter and an outside diameter which are smaller than the inside diameter of the annular frame F and greater than the outside diameter of the wafer 2 adhered to the dicing tape T attached to the annular frame F. In addition, the expansion drum 621 has a support flange 622 at a lower end thereof. The tape expanding means 62 includes supporting means 623 by which the annular frame holding member 611 can be advanced and retracted in the vertical direction. The supporting means 623 is composed of a plurality of air cylinders 623a disposed on the support flange 622, and their piston rods 623b are connected to a lower surface of the annular frame holding member 611. The supporting means 623 thus composed of the plurality of air cylinders 623a moves the annular frame holding member 611 in the vertical direction between a reference position at which the mount surface 611a of the annular frame holding member 611 is at substantially the same height as an upper end of the expansion drum 621 as depicted in FIG. 10A and an expansion position which is a predetermined amount lower than the upper end of the expansion drum 621 as shown in FIG. 10B.

The wafer dividing step carried out using the dividing apparatus 6 configured as above will be described referring to FIGS. 10A to 10C. The annular frame F to which the dicing tape T with the wafer 2 adhered thereto is attached is mounted on the mount surface 611a of the frame holding member 611 constituting the frame holding means 61 and fixed to the frame holding member 611 by the clamps 612, as shown in FIG. 10A (frame holding step). In this instance, the frame holding member 611 is positioned at the reference position shown in FIG. 10A. Next, the plurality of air cylinders 623a as the supporting means 623 constituting the tape expanding means 62 are operated, so as to lower the annular frame holding member 611 to the expansion position depicted in FIG. 10B. Accordingly, the annular frame F fixed on the mount surface 611a of the annular frame holding member 611 is also lowered, so that the dicing tape T attached to the annular frame F is expanded while making contact with an upper end edge of the expansion drum 621, as shown in FIG. 10B (tape expanding step). As a result, radial tensile forces act on the wafer 2 adhered to the dicing tape T, so that the wafer 2 is divided along the division lines 22, along which the aforementioned shield tunnels 25 have been formed continuously and the strength of the wafer 2 has been lowered, into individual device chips having the respective devices 23, with a spacing S being formed between the adjacent device chips.

Figure 10C:
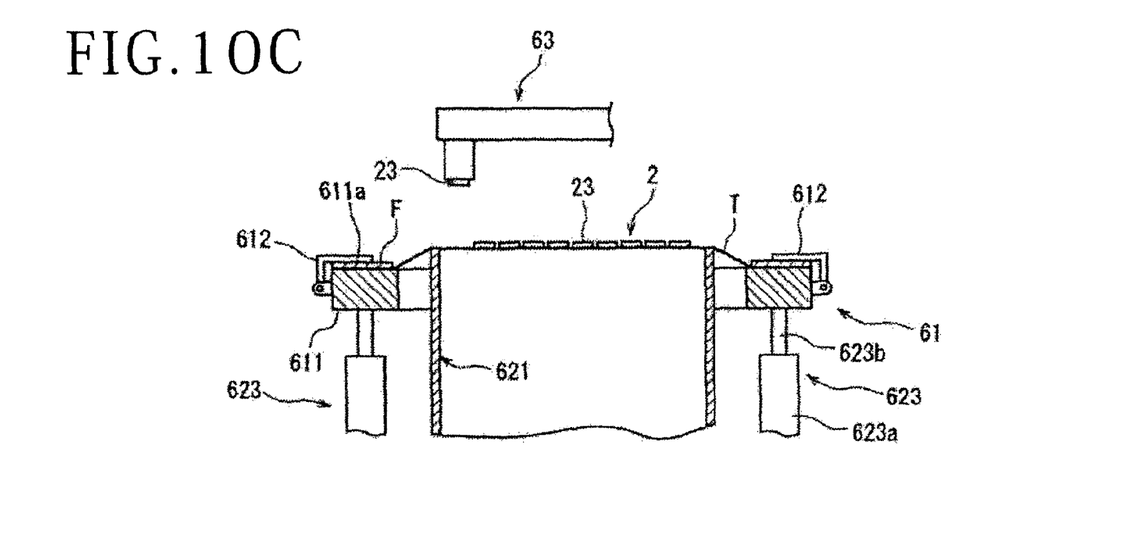

Next, as shown in FIG. 10C, the pick-up collet 63 is operated to pick up the device 23 by capturing the device 23 by suction and stripping the device 23 from the dicing tape T, and the device 23 is conveyed to a tray (not shown) or a die bonding step (not shown). It is to be noted that in the picking-up step, the spacings S between the respective device chips having the devices 23 adhered to the dicing tape T have been expanded as aforementioned, so that each device chip can be easily picked up without making contact with the adjacent device chips.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a wafer formed with a plurality of division lines on a front surface of a single crystal semiconductor substrate having an off angle and formed with respective devices in a plurality of regions partitioned by the division lines, the method comprising:
   a numerical aperture setting step of setting a numerical aperture (NA) of a focusing lens for focusing a pulsed laser beam so that a value obtained by dividing the numerical aperture (NA) by a refractive index (N) of the single crystal semiconductor substrate falls within range from 0.05 to 0.2;
   a shield tunnel forming step of applying the pulsed laser beam along the division lines from a back side of the single crystal semiconductor substrate, with a focal point of the pulsed laser beam positioned at a desired position from a back surface of the single crystal semiconductor substrate, so as to form shield tunnels each composed of a pore and a pore-shielding amorphous portion along the division lines from the focal point positioned inside the single crystal semiconductor substrate; and
   a wafer dividing step of applying an external force to the wafer having been subjected to the shield tunnel forming step so as to divide the wafer along the division lines, along which the shield tunnels have been formed, into individual device chips;
   wherein a film is provided to coat surfaces of the plurality of division lines formed on the front surface of the single crystal semiconductor substrate constituting the wafer, and the method further comprises a film splitting step of applying a laser beam with such a wavelength as to be absorbed in the film to the film along the division lines so as to split the film along the division lines, before the wafer diving step is performed.

2. The method of processing a wafer according to claim 1, further comprising a wafer supporting step of attaching a dicing tape to a back surface of the wafer and supporting an outer peripheral portion of the dicing tape by an annular frame, after the shield tunnel forming step is performed and before the wafer dividing step is performed.

\* \* \* \* \*